(12) United States Patent
Lee

(10) Patent No.: US 6,920,073 B2
(45) Date of Patent: Jul. 19, 2005

(54) ROW REDUNDANCY CIRCUIT AND REPAIR METHOD

(75) Inventor: Chang Hyuk Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/738,087

(22) Filed: Dec. 18, 2003

(65) Prior Publication Data

US 2004/0208068 A1 Oct. 21, 2004

(30) Foreign Application Priority Data

Apr. 21, 2003 (KR) ................. 10-2003-0025052

(51) Int. Cl.$^7$ ................................. G11C 7/00
(52) U.S. Cl. ........................... 365/200; 365/129
(58) Field of Search .................... 365/200, 129

(56) References Cited

U.S. PATENT DOCUMENTS

| | | | | |
|---|---|---|---|---|
| 5,737,511 A | * | 4/1998 | Chang | 714/7 |
| 5,798,973 A | * | 8/1998 | Isa | 365/200 |
| 5,862,086 A | * | 1/1999 | Makimura et al. | 365/200 |
| 6,011,735 A | * | 1/2000 | Ooishi et al. | 365/200 |

FOREIGN PATENT DOCUMENTS

| | | |
|---|---|---|
| KR | 2001-65069 | 7/2001 |
| KR | 2003-22611 | 3/2003 |

* cited by examiner

Primary Examiner—Michael Tran
(74) Attorney, Agent, or Firm—Heller Ehrman LLP

(57) ABSTRACT

A row redundancy circuit comprises a fuse box group array, a redundant row predecoder and a redundant sub-row decoder. The fuse box group array which comprises a plurality of fuse box groups detects whether repaired row addresses are applied. Each fuse box group consists of at least two or more fuse boxes to detect row addresses. The redundant row predecoder performs a logic operation on an output signal from each fuse box group to selectively activate redundant main wordlines each of which correspondings to a plurality of redundant sub-wordlines. The redundant sub-row decoder performs a logic operation on output signals from the fuse box groups, which are classified into group signals corresponding to the number of fuse boxes in each fuse box group, to output a boosting signal for selectively activating the plurality of sub-wordlines corresponding to the each redundant main wordline. In the row redundancy circuit, the space for redundant main wordlines can be effectively utilized because 8 redundant sub-wordlines are controlled by one redundant main wordline.

11 Claims, 4 Drawing Sheets

ROW REDUNDANCY CIRCUIT AND REPAIR METHOD

BACKGROUND OF THE INVENTION

1. Field of the Invention

The present invention generally relates to a row redundancy circuit, and more specifically, to a row redundancy circuit wherein a redundant main wordline corresponds to eight or more redundant sub wordlines to reduce the number of redundant main wordlines and a repair method using the row redundancy circuit.

2. Description of the Background Art

In general, a semiconductor memory having only one defect in one of numerous microscopic cells is considered defective, which results in reduction of yield.

A redundancy circuit, which has been provided to improve the yield, replaces failed cells with normal memory cells prepared in a memory.

That is, the redundancy circuit repairs defective memory cells by replacing wordlines connected defective cells with redundancy wordlines. Specifically, if a row address for selecting defective cells is designated, a conventional row redundancy circuit performs a row redundancy operation by enabling wordlines connected to repaired cells instead of the defective cells.

In the conventional row redundancy circuit, one redundant main wordline corresponds to four redundant sub-wordlines. One of the four redundant sub-wordlines is enabled in response to a signal obtained by predecoding lower 2 bits of the row address for the redundancy operation.

FIG. 1 is a circuit diagram of a conventional row redundancy circuit.

If an address of a defective cell is applied to the row redundancy circuit of FIG. 1, the row redundancy circuit performs a logic operation on output signals rwe0<0>~rwe0<7> and rwe1<0>~rwe1<7> of a fuse box array (not shown) for replacing an address path which selects the defective cell with a path which selects the repaired cell. Then, the row redundancy circuit outputs a control signal rwe_sum for generating control signals rwez0 and rwez1 to enable a repair cell array block and a boosting signal to drive a sub-wordline of the enabled cell array block.

The row redundancy circuit comprises NOR gates NOR1~NOR4, NAND gates ND1~ND3, and inverters IV1 and IV2. The NOR gates NOR1~NOR4 perform a NOR operation on output signals rwe0<0>~rwe0<3>, rwe0<4>~rwe0<7>, rwe1<0>~rwe1<3> and rwe1<4>~rwe1<7> from four adjacent fuse boxes. The NAND gate ND1 performs a NAND operation on output signals from the NOR gates NOR1 and NOR2, and the NAND gate ND2 performs a NAND operation on output signals from the NOR gates NOR3 and NOR4. The inverters IV1 and IV2 invert output signals from the NAND gates ND1 and ND2 to output control signals rwez0 and rwez1, respectively. The NAND gate ND3 performs a NAND operation on output signals from the inverters IV1 and IV2 to output a control signal rwe_sum.

In the conventional row redundancy circuit, each fuse box (not shown) corresponds one by one to a redundant main wordline (not shown) which corresponds to four redundant sub-wordlines (not shown). The conventional row redundancy circuit controls generation of a boosting signal in response to a predecoding signal of lower bits of a repaired row address, thereby selecting one of the four redundant sub-wordlines.

In the conventional row redundancy circuit, the redundant main wordline comprises a metal layer in a core region, and a metal line is assigned every four sub-wordlines. As a result, it is difficult to arrange a power line between main wordlines due to insufficient space.

SUMMARY OF THE INVENTION

Accordingly, it is an object of the present invention to provide a row redundancy circuit comprising a plurality redundant main wordlines each corresponding to a plurality of redundant sub-wordlines (e.g. eight or more: multiples of 4), thereby reducing the number of redundant main wordlines to secure the space of the memory device.

In an embodiment, a row redundancy circuit comprises a fuse box group array, a redundant row predecoder and a redundant sub-row decoder. The fuse box group array which comprises a plurality of fuse box groups detects whether required row addresses are applied. Each fuse box group consists of at least two or more fuse boxes. The redundant row predecoder performs a logic operation on output signals from each fuse box group to selectively activate the redundant main wordlines each of which correspondings to a plurality of redundant sub-wordlines. The redundant sub-row decoder classifies output signals from the fuse box groups into group signals corresponding to the number of fuse boxes in each fuse box group and performs a logic operation on the group signals, to output a boosting signal for selectively activating the plurality of sub-wordlines corresponding to the each redundant main wordline.

A repair method comprises three steps. In the first step, the row redundancy circuit detects whether a repair row address corresponding to one of a plurality of fuse boxes corresponding to each redundant main wordline is applied. In the second step, the row redundancy circuit selectively activates the redundant main wordlines when the repair row address is applied, and decides which fuse box of the plurality of fuse boxes corresponds to the applied repair row address. In the third step, depending on the decision result, the row redundancy circuit classifies a plurality of redundant sub-wordlines corresponding to the activated redundant main wordline into unit groups corresponding to the number of the plurality of fuse boxes in each fuse box group and selectively drives the classified sub-wordlines.

In the row redundancy circuit according to an embodiment of the present invention, one redundant main wordline corresponds to a plurality of (e.g. eight) redundant sub-wordlines more than four redundant sub-wordlines, but one boosting signal for selectively driving redundant sub-wordlines is generated in one group consisting of four redundant sub-wordlines like the conventional boosting signal.

DETAILED DESCRIPTION OF THE PREFERRED EMBODIMENTS

The present invention will be described in detail with reference to the accompanying drawings.

Figure 1:
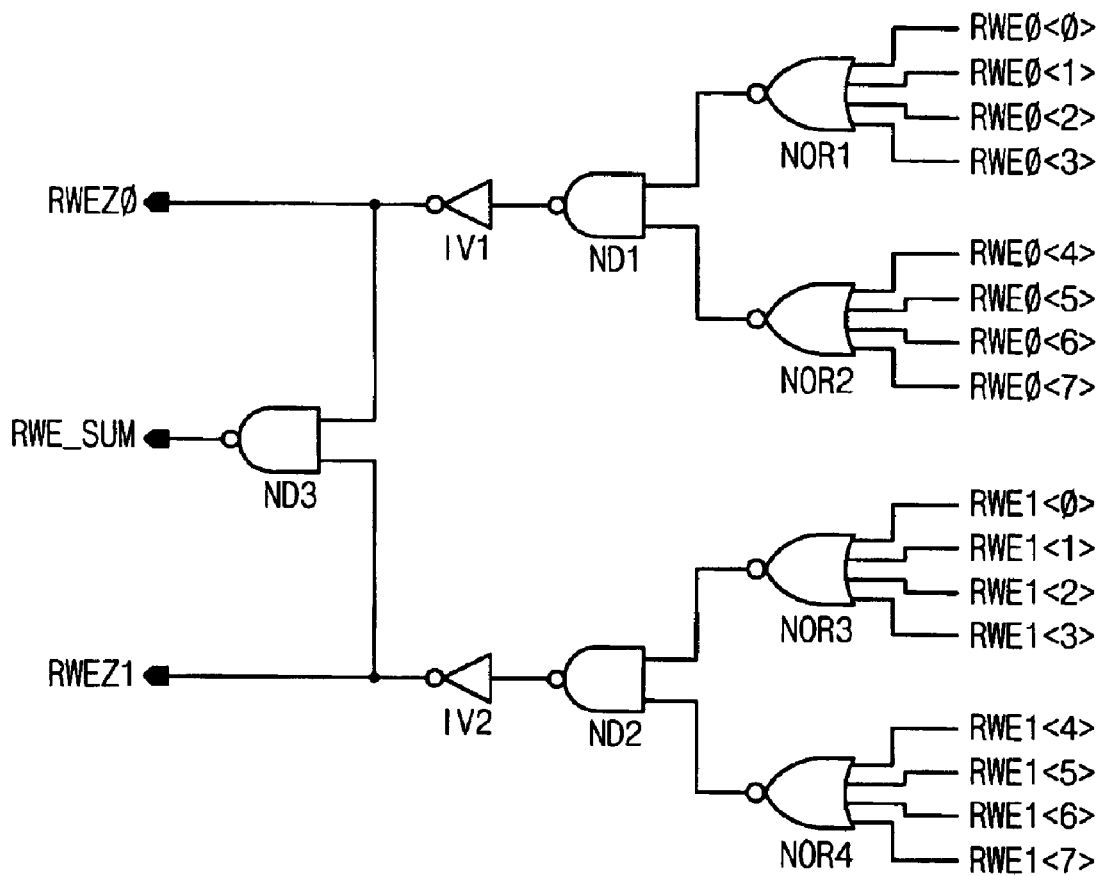
FIG. 1 is a circuit diagram of a conventional row redundancy circuit.
Figure 2:
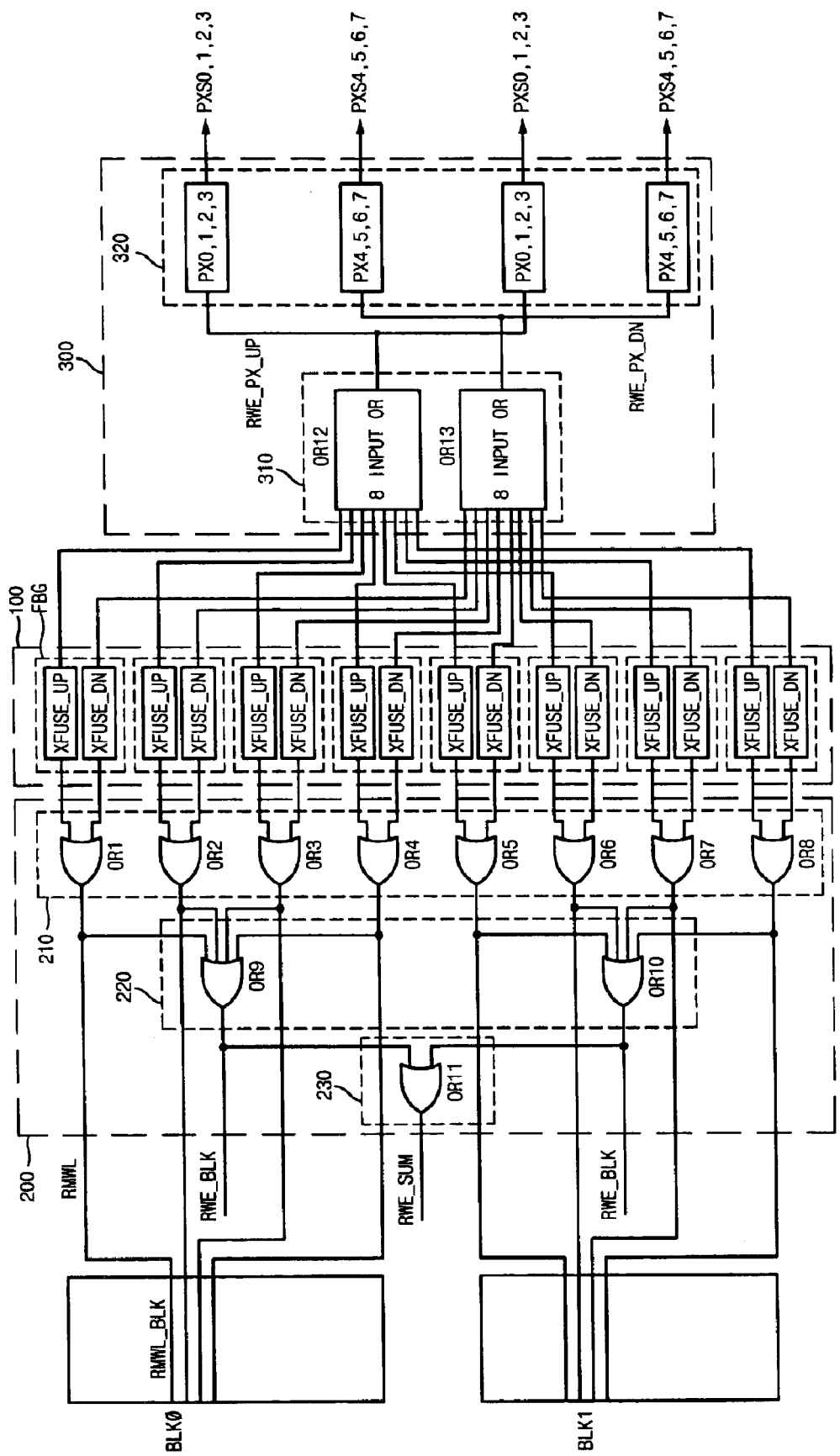
FIG. 2 is a circuit diagram of a row redundancy circuit according to an embodiment of the present invention.

FIG. 2 is a circuit diagram of a row redundancy circuit according to an embodiment of the present invention.

In an embodiment, a row redundancy circuit comprises a plurality of fuse box group and each fuse box group comprises a plurality of fuse boxes XFUSE_UP and XFUSE_DN. Each redundant main wordline RML corresponds to the fuse box group one by one. Each redundant main wordline RMWL corresponds to 8 redundant sub-wordlines (not shown). Since the 8 redundant sub-wordlines are controlled by one redundant main wordline RMWL, the number of redundant main wordlines are reduced by half when compared to the conventional art wherein 4 redundant sub-wordlines are controlled by one redundant main wordline.

The 8 redundant sub-wordlines corresponding to each redundant main wordline RMWL are divided into 2 (the number of the fuse boxes consisting the fuse box group) groups depending on which one of the fuse boxes XFUSE_UP and XFUSE_DN consisting the fuse box group FBG is enabled. If an output signal of the fuse box XFUSE_UP is enabled, one of the 4 upper redundant sub-wordlines is driven. If an output signal of the fuse box XFUSE_DN is enabled, one of the 4 lower redundant sub-wordlines is driven.

The above row redundancy circuit comprises a fuse box group array 100, a redundant row predecoder 200 and a redundant sub-row decoder 300.

The fuse box group array 100 comprises a plurality of fuse box groups FBG. Each fuse box group FBG comprises at least two or more fuse boxes (two fuse boxes XFUSE_UP and XFUSE_DN in an embodiment of the present invention). Each fuse box XFUSE_UP and XFUSE_DN is enabled when a programmed repair row address is applied. As a result, data are written or read through a repaired wordline.

The redundant row predecoder 200 performs a logic operation on output signals from the fuse box group array 100 to selectively activate the redundant main wordlines RMWL and its corresponding cell array blocks BLK0, BLK1. When one of the fuse boxes XFUSE_UP and XFUSE_DN is enabled, the redundant row predecoder 200 activates a boosting control signal RWE_SUM, thereby generating a boosting signal resulting from a redundant mode. On the other hand, when both of the fuse boxes XFUSE_UP and XFUSE_DN are disabled, the redundant row predecoder 200 inactivates the control signal RWE_SUM, thereby generating a boosting signal resulting from a normal mode.

The redundant row predecoder 200 comprises a wordline selector 210, a cell block selector 220 and a boosting signal controller 230. The wordline selector 210 performs a logic operation on output signals from the fuse boxes XFUSE_UP and XFUSE_DN to selectively enable the redundant main wordlines RMWL. The cell block selector 220 performs a logic operation on output signals from the wordline selector 210 to output redundant block selecting signals RWE_BLK. The boosting signal controller 230 performs a logic operation on output signals from the cell block selector 220 to output a boosting control signal RWE_SUM.

The wordline selector 210 comprises OR gates OR1~OR8 for performing an OR operation on output signals from the fuse boxes XFUSE_UP and XFUSE_DN. The cell block selector 220 comprises OR gates OR9 and OR10 for performing an OR operation on output signals from OR gates OR1~OR4 and OR5~OR8 respectively. The boosting signal controller 230 comprises an OR gate OR11 for performing an OR operation on output signals from the OR gates OR9 and OR10.

When one of the fuse boxes XFUSE_UP and XFUSE_DN programmed by different row addresses is enabled, the corresponding redundant main wordline RMWL is activated. Accordingly, redundant sub-wordlines should be driven depending on which fuse box XFUSE_UP or XFUSE_DN is enabled.

The number of redundant sub-wordlines (8 in an embodiment of the present invention) corresponding to one redundant main wordline is divided into unit groups by the number of fuse boxes (2 in an embodiment of the present invention) in the fuse box group FBG. In an embodiment, the redundant sub-row decoder 300 selectively drives the divided redundant sub-wordlines depending on which fuse box FUSE_UP or FUSE_DN is enabled.

The redundant sub-row decoder 300 performs a logic operation on output signals from the fuse boxes XFUSE_UP to generate redundant boosting control signal RWE_PX_UP, and performs a logic operation on output signals from the fuse boxes FUSE_DN to generate redundant boosting control signal RWE_PX_DN. The redundant sub-row decoder 300 classifies boosting signals PXS0~PXS7 into 2 groups, each group consisting of 4 boosting signals such as PXS0~PXS3 and PXS4~PXS7, by using the redundant boosting control signal RWE_PX_UP and RWE_PX_DN. The redundant sub-row decoder 300 selectively generates one of the classified 4 boosting signals PXS0~PXS3 or PXS4~PXS7 in response to predecoding signal LAX01 of lower 2 bits of the row address.

The redundant sub-row decoder 300 comprises a redundant boosting controller 310 and a boosting signal generator 320. The redundant boosting controller 310 performs a logic operation on output signals from the fuse boxes XFUSE_UP or XFUSE_DN in each fuse box group FBG to output the redundant boosting control signal RWE_PX_UP or RWE_PX_DN. Depending on operation modes, the boosting signal generator 320 selectively outputs the boosting signals PXS0~PXS3 or PXS4~PXS7 in response to the redundant boosting control signal RWE_PX_UP or RWE_PX_DN and the predecoding signal LAX01.

The redundant boosting controller 310 comprises 8 input OR gates OR12 and OR13. The 8 input OR gate OR12 performs an OR operation on output signals from the fuse boxes XFUSE_UP. The 8 input OR gate OR13 performs an OR operation on output signals from the fuse boxes XFUSE_DN. The boosting signal generator 320 comprises a first boosting signal generators PX0,1,2,3 and a second boosting signal generators PX4,5,6,7. When the redundant boosting control signal RWE_PX_UP is enabled, the first boosting signal generators PX0,1,2,3 selectively output boosting signals PXS0,1,2,3 depending on predecoding signal LAX01. When the redundant boosting control signal RWE_PX_DN is enabled, the second boosting signal generators PX4,5,6,7 selectively output boosting signals PXS4,5,6,7 depending on predecoding signal LAX01.

Figure 3:
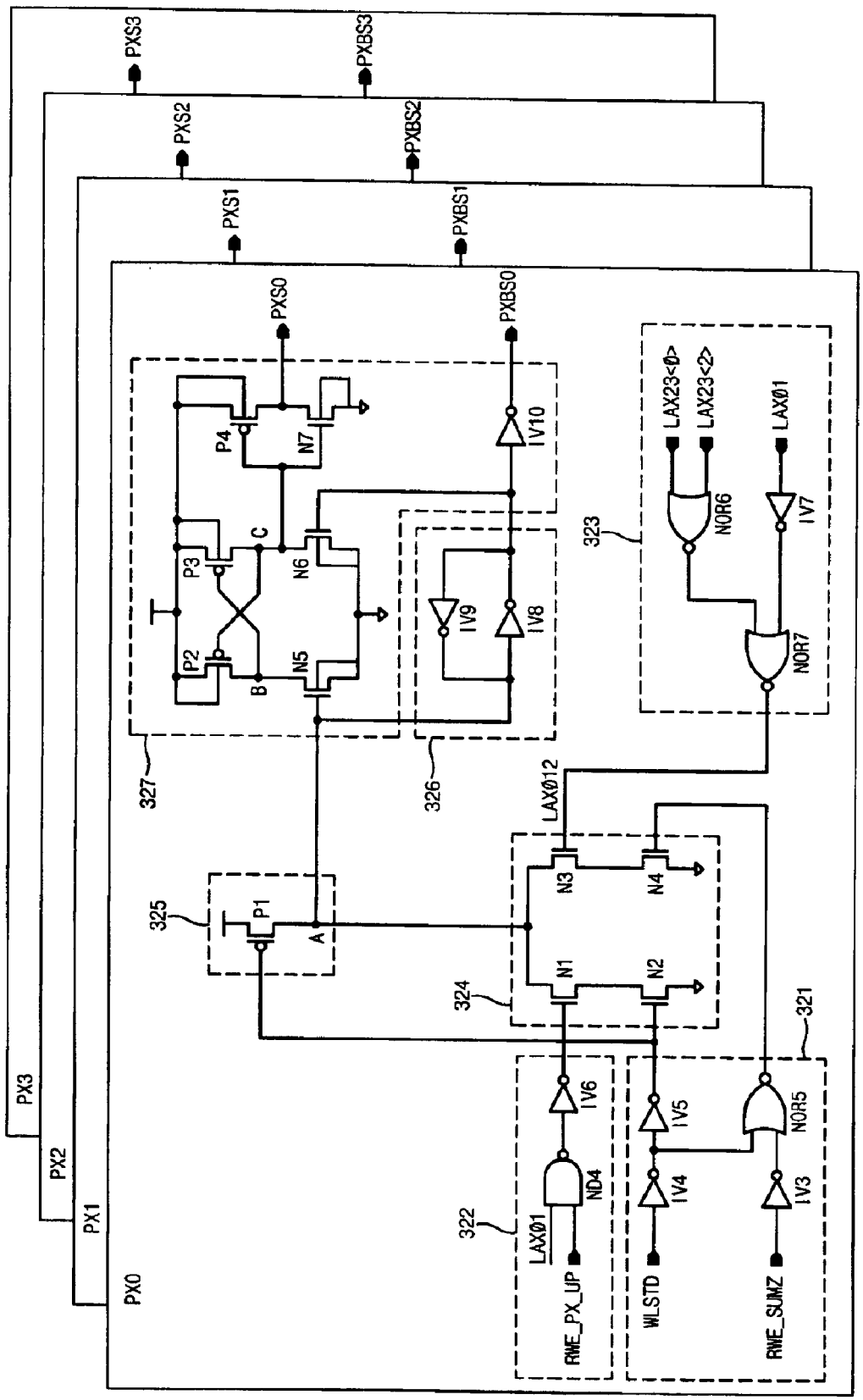
FIG. 3 is a circuit diagram of a boosting signal generator according to an embodiment of the present invention.

FIG. 3 is a circuit diagram of one of the boosting signal generators PX0,1,2,3 according to an embodiment of the present invention.

In an embodiment, the first boosting signal generators PX0,1,2,3 have the same configuration and operation as those of the second boosting signal generators PX4,5,6,7. However, the boosting signal generators PX0,1,2,3 and PX4,5,6,7 are different in values of the applied redundant boosting control signal RWE_PX_UP and RWE_PX_DN and predecoding signal LAX23. The difference is described with the explanation of the first boosting signal generators PX0,1,2,3.

Referring to FIG. 3, a control signal RWE_SUMZ is a signal obtained by inverting the boosting control signal RWE_SUM of FIG. 2, and a control signal WLSTD is a signal which becomes high in an active mode and becomes low in a precharge mode.

The first boosting signal generators PX0,1,2,3 comprises a mode controller 321, a repair controller 322, a normal controller 323, a mode selector 324, a pull-up unit 325, a latch unit 326 and a boosting signal output unit 327.

The mode controller 321 controls generation of boosting signals PXS0,1,2,3 and PXBS0,1,2,3 by operation modes (repair mode or normal mode) depending on activation of the redundant main wordline RMWL. In other words, depending on activation of the redundant main wordline RMWL, the mode controller 321 controls generation of boosting signals PXS0,1,2,3 and PXBS0,1,2,3 for driving redundant sub-wordlines (not shown) or for driving normal sub-wordlines (not shown).

The mode controller 321 comprises an inverter IV3 for inverting the control signal RWE_SUMZ, an inverter IV4 for inverting the control signal WLSTD, an inverter IV5 for inverting an output signal from the inverter IV4 to output the inverted signal into the gate of the NMOS transistor N2, and a NOR gate NOR5 for performing a NOR operation on output signals from the inverters IV3 and IV4 to output the NOR operation result into the gate of the NMOS transistor N4.

In a repair mode, the repair controller 322 controls generation of the boosting signals PXS0,1,2,3 and PXBS0,1,2,3 in response to the redundant boosting control signal RWE_PX_UP (RWE_PX_DN in case of the second boosting signal generators PX4,5,6,7) and the predecoding signal LAX01.

The repair controller 322 comprises a NAND gate ND4 for performing a NAND operation on the redundant control signal RWE_PX_UP (RWE_PX_DN in case of the boosting signal generators PX4,5,6,7) and the predecoding signal LAX01, and an inverter IV6 for inverting an output signal from the NAND gate ND4 to output the inverted signal into the gate of the NMOS transistor N1.

In a normal mode, the normal controller 323 controls generation of boosting signals PXS0,1,2,3 and PXBS0,1,2,3 in response to the predecoding signal LAX012.

The normal controller 323 comprises a NOR gate NOR6 for performing a NOR operation on predecoding signals LAX23<0> and LAX23<2> (LAX23<1> and LAX23<3> in case of the boosting signal generators PX4,5,6,7), an inverter IV7 for inverting the predecoding signal LAX01, and a NOR gate NOR7 for performing a NOR operation on output signals from the NOR gate NOR6 and the inverter IV7. Using the predecoding signals LAX01 and LAX23 as input signals of the normal controller 323 in order to obtain the predecoding signal LAX012 is to utilize the existing predecoding signal LAX23. As a result, an output signal of the normal controller 323 is the same as the predecoding signal Of the 3 lower bits AX0, AX1 and AX2 of the row address.

The mode selector 324 allows the boosting signals PXS0,1,2,3 and PXBS0,1,2,3 of the corresponding operation modes to be enabled in response to an output signal of the mode controller 321. When a repaired row address is applied to enable one of the fuse boxes XFUSE_UP or XFUSE_DN (in a repair mode), the mode selector 324 allows the boosting signals PXS0,1,2,3 and PXBS0,1,2,3 to be generated in response to the redundant boosting control signal RWE_PX_UP (RWE_PX_DN in case of the boosting signal generators PX4,5,6,7) and the predecoding signal LAX01. When a normal row address is applied (in a normal mode), the mode selector 324 allows the boosting signals PXS0,1,2,3 and PXBS0,1,2,3 to be generated in response to the predecoding signal LAX012.

The mode selector 324 comprises NMOS transistors N1, N2, N3 and N4. The NMOS transistors N1 and N2, connected in series between a node A and a ground voltage terminal, have each gate connected to each output terminal of the inverters IV6 and IV5. The NMOS transistors N3 and N4, connected in series between the node A and the ground voltage terminal, have each gate connected to each output terminal of the NOR gates NOR7 and NOR5.

The pull-up unit 325 pulls up a voltage of the node A in response to the control signal WLSTD in a precharge mode. That is, in the precharge mode, the pull-up unit 325 pulls up the voltage of the node A to disable a boosting signal.

The pull-up unit 325 comprises a PMOS transistor P1, connected between the power voltage and the node A, having a gate connected to an output terminal of the inverter IV5.

The latch unit 326 latches an output signal from the pull-up unit 325. The latch unit 326 comprises inverters IV8 and IV9 whose input terminal and output terminal are interconnected.

The boosting signal output unit 327 outputs the boosting signals PXS0,1,2,3 and PXBS0,1,2,3 in response to output signals from the pull-up unit 325 and the latch unit 326.

The boosting signal output unit 327 comprises PMOS transistors P2, P3 and P4, NMOS transistors N5, N6 and N7, and an inverter IV10. The PMOS transistor P2 and the NMOS transistor N5, connected in series between the power voltage terminal and the ground voltage terminal, have each gate connected to a node C and the node A, respectively. The PMOS transistor P3 and the NMOS transistor N6, connected in series between the power voltage terminal and the ground voltage terminal, have each gate connected to a node B and an output terminal of the latch unit 326. The PMOS transistor P4 and the NMOS transistor N7, connected in series between the power voltage terminal and the ground voltage terminal with a push-pull type, have each gate connected to the node C in common to output the boosting signals PXS0,1,2,3. The inverter IV10 inverts an output signal from the latch unit 326 to output the boosting signals PXBS0,1,2,3.

Figure 4:
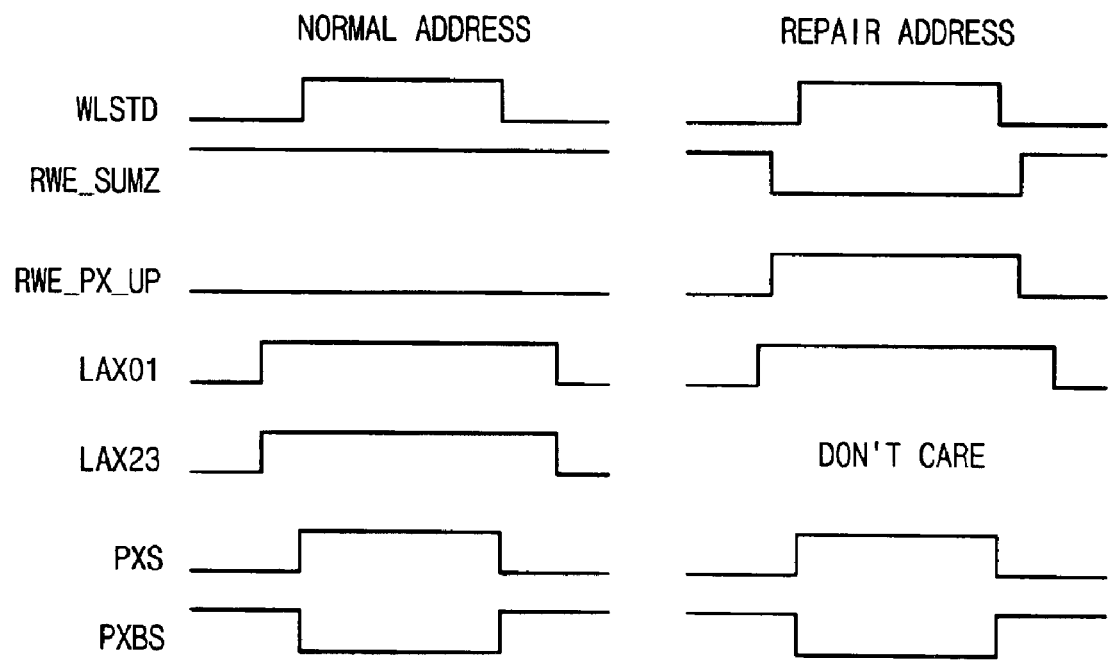
FIG. 4 is a timing diagram of the operation of the boosting signal generator of FIG. 3.

FIG. 4 is a timing diagram of the operation of the boosting signal generator of FIG. 3.

When a normal row address is applied, the fuse boxes XFUSE_UP and XFUSE_DN output a low level signal. The control signal RWE_SUMZ is maintained at a high level, and the redundant boosting control signals RWE_PX_UP and RWE_PX_DN are maintained at a low level. When the control signal WLSTD becomes at the high level by activating of the corresponding bank, the NMOS transistor N2 is turned on. However, since the redundant boosting control signal RWE_PX_UP is maintained at the low level, the NMOS transistor N1 is turned off. As a result, when a normal address is applied, a signal from the repair controller 322 does not affect generation of the boosting signals PXS0,1,2,3 and PXBS0,1,2,3.

If a mode selecting signal of the mode controller 321 transits to a high level and the NMOS transistor N4 is turned on, the voltage of the node A is pulled down depending on on/off states of the NMOS transistor N3. If the predecoding signals LAX01 and LAX23 to generate the predecoding signal LAX012 are enabled, the NMOS transistor N3 is turned on and the voltage of the node A is pulled down. Then, the NMOS transistor N6 is turned on by the latch unit 326, and the node C is pulled down. As a result, the PMOS transistor P4 is turned on to output the enabled boosting signal PXS0. The predecoding signals LAX23<0> and LAX23<2> are replaced with the predecoding signals LAX23<1> and LAX23<3> in case of the boosting signal generators PX4,5,6,7.

When the repaired row address is applied, an output signal from the fused box programmed to the corresponding row address is enabled. If an output signal of the fuse box XFUSE_UP (or XFUSE_DN) is enabled, the control signal RWE_SUMZ transits to a low level and the redundant boosting control signal RWE_PX_UP (RWE_PX_DN in case of the fuse box XFUSE_DN) transits to a high level.

If the control signal WLSTD becomes at the high level by activating of the corresponding bank, the NMOS transistor N2 is turned on. A mode selecting signal of the mode controller 321 transits to a low level, and the NMOS transistor N4 is turned off. As a result, the predecoding signal LaX012 does not affect generation of the boosting signals PXS0,1,2,3 and PXBS0,1,2,3. The voltage of the node A is pulled down when the NMOS transistor N1 is turned on. That is, the voltage of the node A is controlled by the predecoding signal LAX01 of the repair controller 322.

If the predecoding signal LAX01 is enabled, the NMOS transistor N1 is turned on. Then, the voltage of the node A pulled up by the pull-up unit 325 is pulled down. In a repair mode, the predecoding signal LAX23 is not considered. When the node A is pulled down, the NMOS transistor N6 is turned on to pull down the node C. As a result, the PMOS transistor P4 is turned on to enable the boosting signals PXS0,1,2,3.

The boosting signals PX4,5,6,7 are also generated when the redundant boosting control signal RWE_PX_DN is enabled. That is, in a repair mode, the generation of the boosting signals PX0,1,2,3 or PX4,5,6,7 is determined depending on which redundant boosting control signal RWE_PX_UP or RWE_PX_DN is enabled.

The enabled boosting signals PX0,1,2,3 are disabled when the node A is pulled up by the pull-up unit 325 in a precharge mode.

Although one redundant main wordline corresponds to 8 redundant sub-wordlines in the row redundancy circuit according to the above embodiment of the present invention, the number of redundant sub-wordlines corresponding to one redundant main wordline may be 12, 16, . . . and more (multiples of 4).

For example, when one redundant main wordline corresponds to 12 redundant sub-wordlines, each fuse box group FBG comprises 3 fuse boxes to output 3 boosting control signals. As a result, 12 redundant sub-wordlines are classified into three groups consisting of 4 redundant sub-wordlines, and then selectively enabled.

As discussed earlier, in a row redundancy circuit according to an embodiment of the present invention, the space for redundant main wordlines can be effectively utilized because 8 redundant sub-wordlines are controlled by one redundant main wordline.

What is claimed is:

1. A row redundancy circuit comprising:
   a fuse box group array having a plurality of fuse box groups for detecting whether repaired row addresses are applied, wherein each fuse box group consists of at least two or more fuse boxes;
   a redundant row predecoder for performing a logic operation on output signals from the fuse box groups to selectively activated redundant main wordlines each of which corresponds to a plurality of redundant sub-wordlines; and
   a redundant sub-row decoder for classifying the output signals from the fuse box groups into group signals corresponding to the number of fuse boxes in each fuse box group and performing a logic operation on the group signals, to output a boosting signal for selectively activating the plurality of sub-wordlines corresponding to the each redundant main wordline.

2. The row redundancy circuit according to claim 1, wherein the redundant row predecoder selectively activates the redundant main wordlines when one of fuse boxes in the fuse box group corresponding to the redundant main wordlines is enabled.

3. The row redundancy circuit according to claim 2, wherein each fuse box group corresponds to one of the redundant main wordlines, and the redundant main worlines corresponds to 4×N (N: the number of fuse boxes in the fuse box group) redundant sub-wordlines.

4. The row redundancy circuit according to claim 1, wherein the redundant row predecoder activates a corresponding cell array block and outputs a boosting control signal for controlling the boosting signal into the redundant sub-row decoder, when the redundant main wordline is activated.

5. The row redundancy circuit according to claim 4, wherein the redundant sub-row decoder comprises:
   a redundant boosting controller for classifying the output signals from the fuse box group array into the group signals corresponding to the number of fuse boxes in each fuse box group and performing a logic operation on the classified signals, to output redundant boosting control signals; and
   a boosting signal generator for generating the boosting signal in response to the redundant boosting control signals and a predecoding signal of the row address when the boosting control signal is activated.

6. The row redundancy circuit according to claim 5, wherein the boosting signal generator comprises:
   a first boosting signal generator for selectively generating boosting signals to drive four redundant sub-wordlines corresponding to first fuse boxes when a first redundant boosting control signal obtained by performing an OR operation on output signals of the first fuse boxes in each fuse box groups is enabled; and
   a second boosting signal generator for selectively generating boosting signals to drive four redundant sub-wordlines corresponding to second fuse boxes when a second redundant boosting control signal obtained by performing an OR operation on output signals of the second fuse boxes in each fuse box groups.

7. The row redundancy circuit according to claim 5, wherein the boosting signal generator comprises:
   a mode controller for controlling the generation of the boosting signal depending on the boosting control signal and a control signal which is enabled when a corresponding bank is activated and becomes disabled when the bank is precharged;
   a repair controller for controlling the generation of the boosting signal in response to a predecoding signal of lower 2 bits of the row address and one of the redundant boosting control signals in a repair mode;
   a normal controller for controlling the generation of the boosting signal in response to the predecoding signal of lower 3 bits of the row address in a normal mode;

a pull-up unit for pulling up an output node when a corresponding bank is precharged;

a mode selector for pulling down the output node in response to an output signal from the repair controller or the normal controller depending on operation modes by the mode controller;

a latch unit for latching an signal of the output node; and a boosting signal output unit for generating a boosting signal in response to the signal of the output node and output signals from the latch unit.

8. A repair method comprising:

a first step of detecting whether a repair row address corresponding to one of a plurality of fuse boxes corresponding to each of redundant main wordlines is applied;

a second step of selectively activating the redundant main wordlines when the repair row address is applied, and of deciding which fuse box of the plurality of fuse boxes corresponds to the applied repair row address; and a third step of selectively driving a plurality of redundant sub-wordlines corresponding to the activated redundant main wordline depending on the decision result, whrein the redundant sub-wordlines are classified into unit groups corresponding to the number of the plurality of fuse boxes.

9. The repair method according to claim 8, wherein the plurality of fuse boxes are grouped to fuse box groups each of which corresponds to a redundant main wordline.

10. The repair method according to claim 9, wherein the second step comprises deciding which fuse box corresponds to the repair row address by performing an OR operation on output signals of first fuse boxes and second fuse boxes in the fuse box groups, respectively.

11. The repair method according to claim 10, wherein the third step comprises selectively driving the redundant sub wordlines classified into the unit groups in response to a predecoding signal of specific 2 bits of the applied repair address.

* * * * *